United States Patent
Taenzer

(10) Patent No.: US 8,085,941 B2
(45) Date of Patent: Dec. 27, 2011

(54) SYSTEM AND METHOD FOR DYNAMIC SOUND DELIVERY

(75) Inventor: Jon C. Taenzer, Los Altos, CA (US)

(73) Assignee: Dolby Laboratories Licensing Corporation, San Francisco, CA (US)

(*) Notice: Subject to any disclaimer, the term of this patent is extended or adjusted under 35 U.S.C. 154(b) by 908 days.

(21) Appl. No.: 12/150,970

(22) Filed: May 2, 2008

(65) Prior Publication Data

US 2009/0274310 A1    Nov. 5, 2009

(51) Int. Cl.
    *H03G 7/00* (2006.01)
(52) U.S. Cl. .................. 381/57; 381/104; 381/106
(58) Field of Classification Search .......... 381/57, 381/106
    See application file for complete search history.

(56) References Cited

U.S. PATENT DOCUMENTS

| | | | |
|---|---|---|---|
| 4,630,305 A | 12/1986 | Borth et al. | |
| 5,319,736 A | 6/1994 | Hunt | |
| 6,970,558 B1 | 11/2005 | Schmidt | |
| 7,302,062 B2 * | 11/2007 | Christoph | 381/57 |
| 8,005,231 B2 * | 8/2011 | Shuttleworth et al. | 381/57 |
| 2003/0223597 A1 | 12/2003 | Puria et al. | |

OTHER PUBLICATIONS

PCT International Search Report from PCT/US2009/042629 dated Jun. 25, 2009.

Examiner's first report issued in Australia patent application 2009242464 dated Aug. 12, 2011.

* cited by examiner

*Primary Examiner* — Minh-Loan T Tran
(74) *Attorney, Agent, or Firm* — Nixon Peabody LLP

(57) ABSTRACT

A dynamic range manipulation system, for use for example in an audio playback system such as a two-way communication system, mobile telephone, MP3 player, and the like, obtains a measure of ambient noise at the playback location and adjusts the gain of the drive signal provided to the loudspeaker based on this measure and based on the audio signal to be played back.

57 Claims, 7 Drawing Sheets

SYSTEM AND METHOD FOR DYNAMIC SOUND DELIVERY

TECHNICAL FIELD

The present disclosure relates to audio playback, for example in two-way communication systems such as cellular telephones and walkie-talkies.

BACKGROUND

Ambient noise may sometimes interfere with the delivery of audio information. In a two-way communication system for example, in which the far-end talker is at a location remote from the near-end listener, the far-end talker, ignorant of the noise conditions at the listener's location, may not take measures to compensate for the occurrence of disruptive noise events (instantaneous or sustained). For example, the talker, unaware of a passing car at the listener's location, may not raise his/her voice to maintain audibility to the listener, and the talker's words may be not be heard or understood by the listener, even if the system were electrically and mechanically capable of handling such compensation. The inability of the listener to discern the talker's speech under such circumstances is due to the well known psychophysical phenomenon called "masking", that is when loud enough, the local noise covers up, or masks, the played-back far-end sound signal. This problem is not limited to two-way communication systems of course, and ambient noise may similarly interfere with pre-recorded voices, any pre-stored audio information that is being played back.

Overview

As described herein, a dynamic range manipulation system includes a first input configured to provide an information signal, a second input configured to provide a noise indication signal, and a processor configured to receive the information signal and the noise indication signal, and to generate a gain-controlled output signal based on a determination of power in the information signal and the noise signal.

Further as described herein, an audio playback device includes an information source configured to provide an information signal, a loudspeaker configured to present audio information in accordance with a playback drive signal, a noise indication signal source configured to provide a noise indication signal based on ambient noise at the location of the loudspeaker, and a processor configured to generate the playback drive signal as a function of the information signal and the noise indication signal, the processor effecting gain control of the playback signal based on a determination of power in the information signal and the noise signal.

Also described herein is a method for compensating for ambient noise at a playback location. The method includes receiving an ambient noise signal indicative of the ambient noise, receiving an information signal, and generating an output signal that is gain-controlled as a function of power in the ambient noise signal and the information signal.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

In the drawings.

DESCRIPTION OF EXAMPLE EMBODIMENTS

Figure 1A:
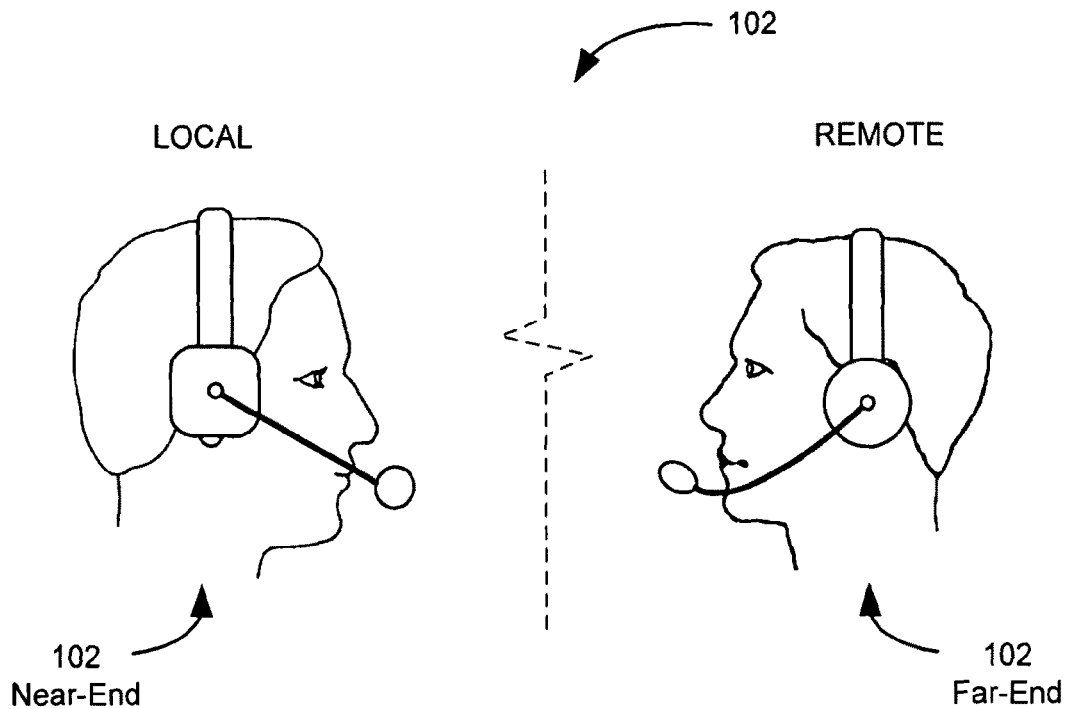
FIG. 1A is a diagram of a two-way audio communication system 100 enabling two users to remotely communicate with one another.

Example embodiments are described herein in the context of a system and method for dynamic sound delivery. Those of ordinary skill in the art will realize that the following description is illustrative only and is not intended to be in any way limiting. Other embodiments will readily suggest themselves to such skilled persons having the benefit of this disclosure. Reference will now be made in detail to implementations of the example embodiments as illustrated in the accompanying drawings. The same reference indicators will be used to the extent possible throughout the drawings and the following description to refer to the same or like items.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with this disclosure, the components, process steps, and/or data structures described herein may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Erasable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card, paper tape and the like) and other types of program memory.

The example embodiments described herein are presented in the context of a processes implemented using a digital signal process. It will be recognized that each process step can be accomplished with alternative implementations, for example, using analog circuits. While the hardware supporting an analog implementation would appear different from the hardware implementation in the digital domain, the fundamental nature of each of the corresponding process steps is equivalent. Thus, the processes described herein are intended to be applicable to any hardware implementation in either the analog or digital domain.

FIG. 1A is a diagram of a two-way audio communication system 100 enabling two users to remotely communicate with one another. Each user is provided with a communication device 102, shown in more detail in the block diagram of FIG. 1B. Each communication device 102 includes microphone 104, loudspeaker 106, transceiver 108, and processor or controller 110. In a first communication "circuit," the voice of the user at a remote or far-end location is picked up by a microphone 104 of the communication device 102 at that user's location, and is transmitted, wirelessly or otherwise, for playback by a loudspeaker 106 of the communication device 102 at the local or near-end user's location. Similarly, in a second communication "circuit," the voice of the user in the local or near-end location is picked up by a microphone 104 of a near-end communication device 102 and is played back by a loudspeaker 106 at the remote or far-end location.

The communication system 100 is considered a two-way system, as it contains two communication "circuits" as described. However, it should be understood that the implementations described herein relate to the communication "circuits" individually, and therefore are not limited to two-way systems. Rather, they are also applicable to one-way systems, in which a local or near-end user is only able to hear a remote user, and is unequipped to speak to the remote user, or vice versa. Even more generally, the implementations described herein are applicable to systems that may be exclusively for playback or presentation of audio information, such as music, sound signals and pre-recorded voices, regardless of the state or location of the source of the audio information, and no remote user or audio source need be involved. Such systems include for instance portable and non-portable audio systems such as walkmans, compact disk players, home stereos, television sets, personal digital assistants (PDAs), and so on. In such systems, unlike in two-way communication system 100, playback is not necessarily effected in real time—that is, the audio information is not necessarily presented at the same time that it is created.

Returning to FIG. 1B, the information that the transceiver 108 is expected to transmit in this example is sound signals such as the user's voice, which is picked up by microphone 104 and converted to electrical signals that are forwarded to the transceiver either directly, or by way of controller 110 as depicted. When passed through controller 110, picked-up information can be packaged into suitable form for transmission in accordance with the particular application and/or protocol to be observed between the devices 102 of the communication system 100. Following this packaging, which may be one of numerous types of modulation, for example, the information is forwarded to transceiver 108 for transmission. Conversely, transceiver 108 serves to forward information that it receives, wirelessly or otherwise, to the controller 110 for "unpackaging," and, as detailed below, for processing and manipulation such that when the information is converted to acoustic form during playback by loudspeaker 106, it remains intelligible—or retains its original message or character as much as possible—regardless of the noise environment in which the listening user is immersed.

Transceiver 108 is configured to effect transmission and/or reception of information, and can be in the form of a single component. Alternatively, separate components dedicated to each of these two functions can be used. Transmission can take place wirelessly, by way of modulated radio signals for example, or in a wired fashion using conventional electrical cabling, or even optically using fibers or through line-of-sight.

Figure 1B:
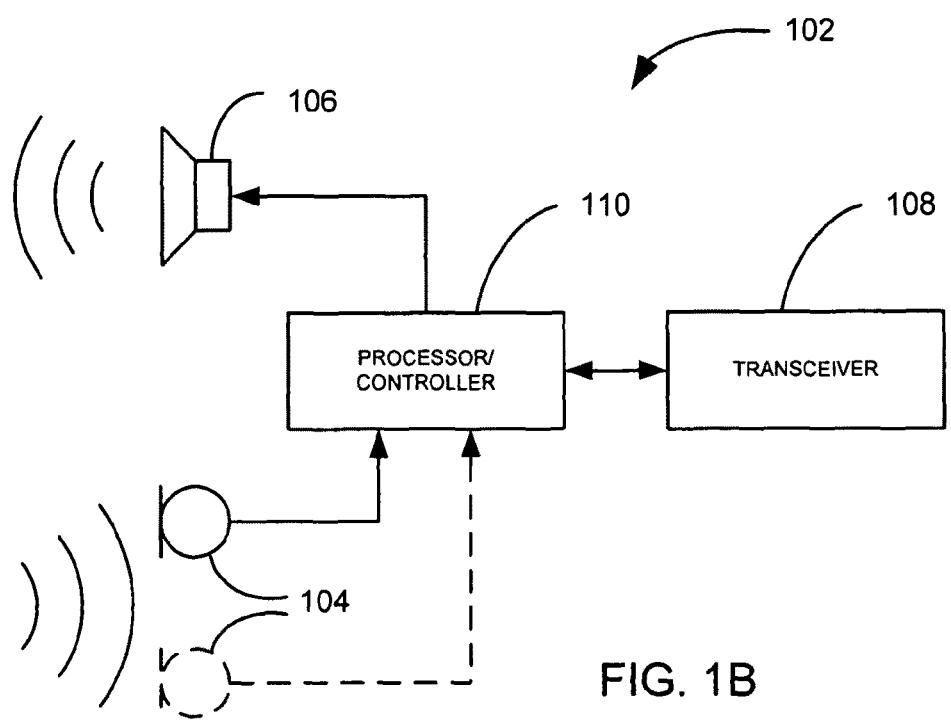
FIG. 1B is a block diagram of a communication device 102 of communication system 100 of FIG. 1A.

Since, in the example of FIGS. 1A and 1B, the far-end talker is at a location remote from the near-end listener, the talker may be ignorant of the noise conditions at the listener's location, and the talker may not take measures to compensate for the occurrence of disruptive noise events (instantaneous or sustained) at the distant location of the listener because the talker may not be aware of their occurrence. To give a simple example, the talker, unaware of a passing car at the listener's location, may not raise his voice to maintain his/her audibility to the listener, and his/her words may be not be heard or understood by the listener, even if the system were electrically and mechanically capable of handling such compensation. The inability of the listener to discern the talker's speech under such circumstances is due to the well known psycho-physical phenomenon called "masking", that is when loud enough, the local noise covers up, or masks, the played-back far-end sound signal. Nevertheless, as set forth herein, controller 110 may be made aware of the disruptive audio events, and it, and, if necessary, the other components, can be equipped to take necessary measures to compensate for it or minimize its impact.

Figure 2:
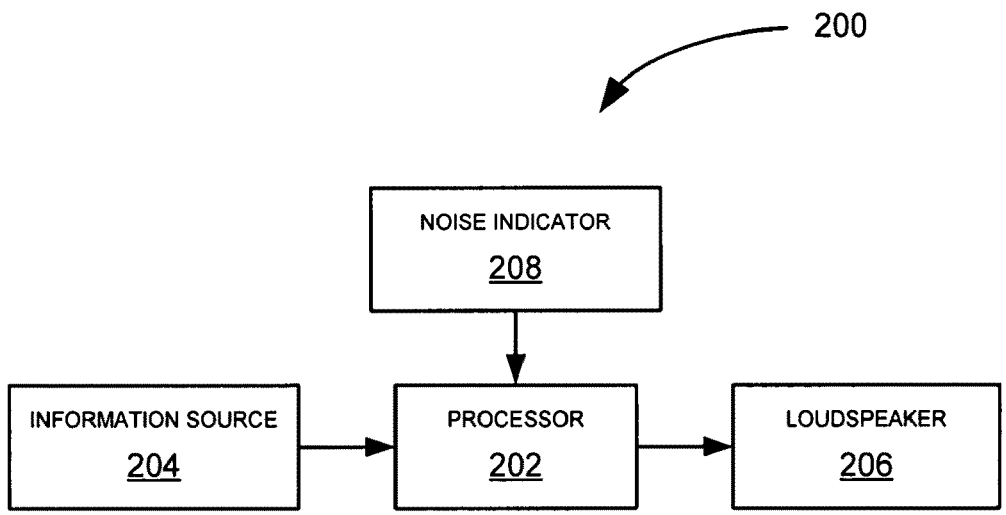
FIG. 2 is a block diagram of a dynamic sound delivery system.

As previously explained, while the description herein may be in the context of a two-way communication system, this is not intended to be limiting, and applications in systems that are exclusively for playback of audio information, such as music, sound signals and pre-recorded voices are also contemplated, regardless of the state or nature of the audio information source, and in real time or otherwise. FIG. 2 illustrates such a generalized application, wherein, in a dynamic sound delivery system 200, a processor 202 operates on audio information provided by an audio information source 204, manipulating the information and taking necessary measures to compensate for compromised listening environment conditions before delivering it in the form of an output drive or playback signal to a loudspeaker 206 for presentation or playback to a user. In system 200, a representation or weight of the ambient audio noise at the playback location is generated by an audio noise indicator 208. In such cases, the playback systems may be equipped with a microphone, if one is not already available. The manipulation and compensation is conducted in real-time and may be either continuous or in the form of discrete instantaneous samplings. The representation or weight, which may hereinafter be referred to as the ambient noise indicia, or noise indicia, is provided to the processor 202, which uses it, in conjunction with the information signal from information source 204, to effect the necessary compensation at playback.

The indicator 208 from which the indicia may be derived can be a simple microphone, or an array of microphones (for example microphone(s) 104 of FIG. 1B), that is/are used to detect ambient noise at the playback location. Alternatively (or in addition), the noise indicia can be derived from ancillary processing operations that are performed elsewhere in the system, or in a connected system, for the same or a related purpose, or for a different purpose altogether. For instance, in a two-way system, the noise indicia may be derived from a noise reduction algorithm used at the near-end to enhance an outgoing audio signal in the presence of the ambient noise. A determination of the ambient noise can be obtained by such a noise reduction algorithm in a variety of ways, and this determination can be used to provide the noise indicia needed by the dynamic sound delivery system 200 to improve playback. The noise reduction algorithm for the outgoing audio signal often uses multi-band methods to create a set of attenuation values that are applied to the outgoing noisy signal by multiplication. The attenuation values may be a number between "0" and "1". When applied to the outgoing noisy signal they act to reduce the noise therein by attenuating portions of the noisy signal that are deemed to be mostly or only noise, while not attenuating, or attenuating to a lesser degree, portions that are deemed to be the desired signal. The dynamic sound delivery system 200 can obtain the noise indicia by subtracting each attenuation value from "1". The dynamic sound delivery system 200 can then apply the thus-derived "anti-attenuation" values to the original noisy signal to thereby derive the noise indicia from noise indicator 208. Further, in one variation, discussed at length below, it may be desirable to use the attenuation values themselves by 1) squaring them so they represent a power percent, 2) summing the resulting values within each frequency band to obtain a total percentage measure of non-noise power per band, 3) calculating the total power of the original noisy signal in each band, and 4) multiplying the noise percentage, which is 100% minus the non-noise power percentage, times the total power to get a noise-only power measure in each band.

As explained in more detail below, the dynamic sound delivery system 200 of FIG. 2 may be configured to operate as a multi-band dynamic range processor that uses compression to adjust the dynamic range of the signal that is to be played back in the noisy near-end environment. The system 200 applies selective gain control to the output playback signal that is used to drive loudspeaker 206, which gain control is a function of both the audio information from information source 204, and the ambient noise conditions (noise indicia) from noise indicator 208. Depending on the particular circumstances, portions of the output drive signal may be subject to no compression, or even downward expansion.

Figure 3:
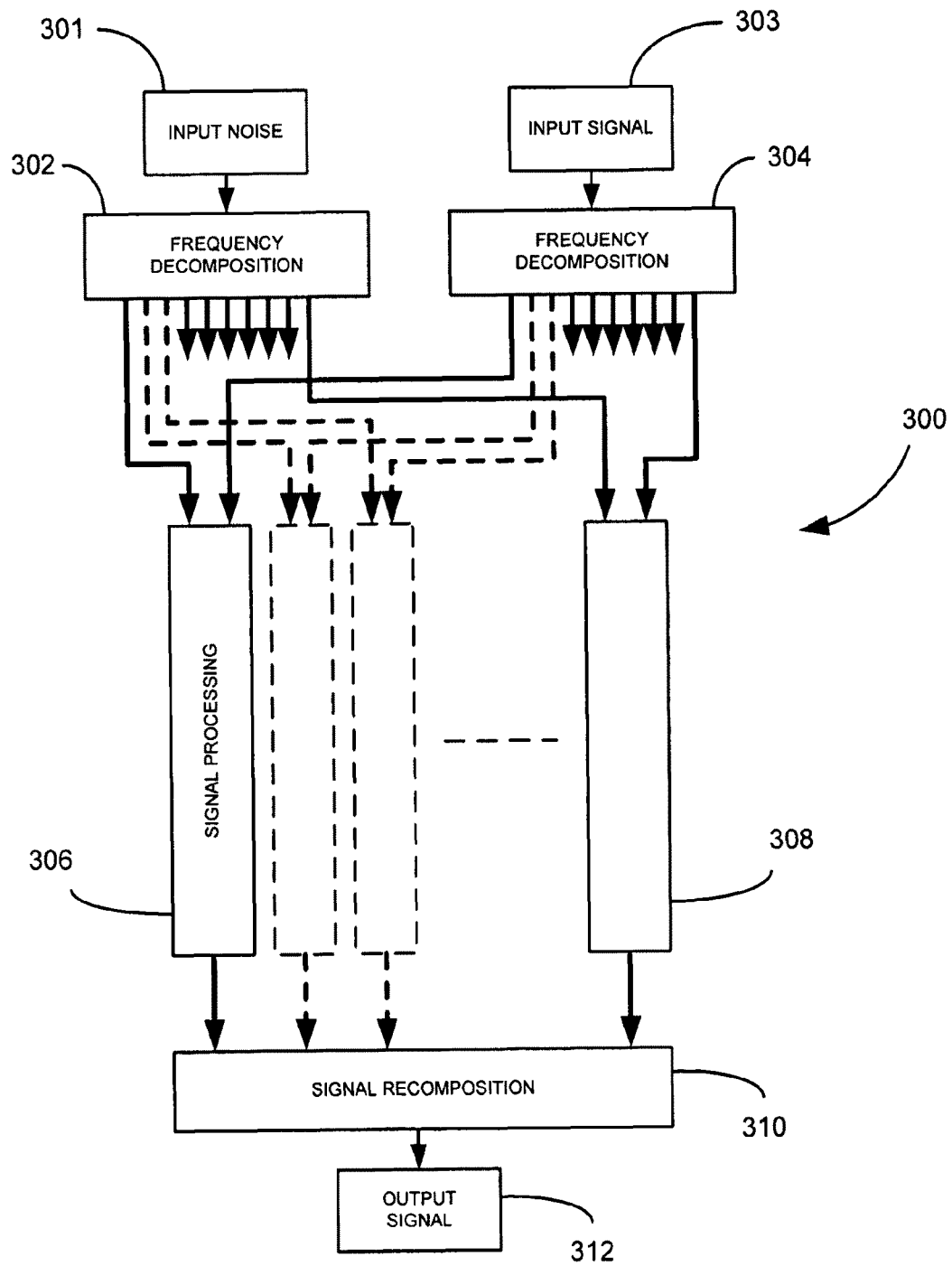
FIG. 3 is a block diagram of a dynamic range manipulation system 300 which may constitute part of processor 202 of FIG. 2 (and of controller 110 of FIG. 1B).

FIG. 3 is a block diagram of a dynamic range manipulation system 300 which may constitute part of processor 202 of FIG. 2 (and of controller 110 of FIG. 1B). Processor 202 may include other processing modules or circuits having different functions from those described hereinbelow. While, as previously explained, the processing carried out by dynamic range manipulation system 300 can be implemented as either a single-band or a multi-band process, the example of FIG. 3 relates to the multi-band approach. Herein, each band of the multi-band process will be referred to as a sub-band and the example embodiments will be discussed in the context of a two sub-band process, although this is not intended to be limiting. In an example embodiment, the cutoff between the two sub-bands is selected to be at about 1 kHz. Audio signals below 1 kHz generally contain vowel sounds of speech which may denote speech loudness, while those above 1 kHz generally contain the more information-rich consonant sounds. More specifically, and by way of example only, the lower sub-band extends from about 50 Hz to about 1 kHz, while the upper sub-band extends from about 1 kHz to about 3.5 kHz. By way of the two sub-band example, signal processing module 306 provides the lower sub-band dynamic range manipulation process while signal processing module 308 provides the upper sub-band dynamic range manipulation process. A single-band implementation requires only signal processing module 306, which would then be configured to include the entire desired spectrum, while a many sub-band implementation requires additional signal processing modules, as indicated by the signal processing modules shown in dashed lines in FIG. 3

The dynamic range manipulation system 300 receives the audio noise indicator signal at a first input 301 thereof, and provides that signal to a first frequency decomposition module 302, where it is resolved into frequency bins or bands. As previously explained, the audio noise indicator signal is indicative of the ambient noise at the playback location. The dynamic range manipulation system 300 receives the audio information signal at a second input 303, and provides it to a second frequency decomposition module 304. Frequency decomposition module 304 resolves this audio information signal into frequency bins or bands as well.

In the two-way communication system of FIGS. 1A and 1B, this audio information signal is representative of the talker's voice from the remote, far-end location, as picked up by microphone 104 of the communication device 102 at the far-end location and transmitted to the near-end communication device 102 where it is to be played back. More generally, however, the audio information is from an information source 204 as shown in FIG. 2, and may for example be stored music, pre-recorded voices, and the like, and is not necessarily limited to being played back in real time.

Figure 4:
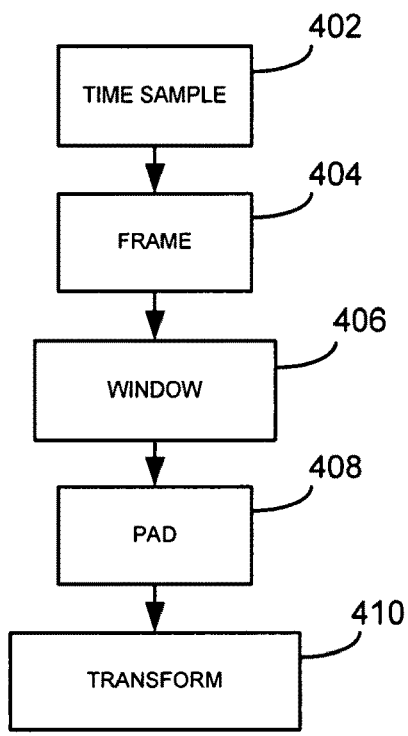
FIG. 4 is a block diagram relating to a standard short time Fourier transform (STFT) process.

In the example two sub-band embodiment, frequency decomposition modules 302 and 304 each apply a standard short time Fourier transform (STFT) process on the respective input signals from inputs 301 and 303. This process is explained with reference to flow diagram 400 of FIG. 4. Time samples of the signals are taken (402) and divided into frames (404), which are windowed (406) (windowing techniques involving multiplication are known). Zero padding may be performed (408), and the padded frames of temporal data are transformed (410) into the frequency domain using, in this example, fast Fourier transformation (FFT). Other available transform methods include cosine transforms, Hartley transforms, wavelet transforms, and so on. By way of example, 16-bit words and a sample rate of 8 ksps (kilosamples per second), with a frame of 384 samples that are windowed with a perfect reconstruction audio window and padded to 512 samples to increase frequency resolution of the result, are used. A total number of 257 frequency "bins" are thus obtained (including the Nyquist frequency and DC half-bins). A frame advance of 56 samples is used to deliver 143 frames per second operation. Thus the control process operates at the sub-sampled rate of 143 times per second, well above the modulation rate of speech and hearing (~30 Hz), but below the raw sample rate of 8 ksps for saving compute power.

In the frequency domain example embodiment, the frequency bins are assembled into groups, or sub-bands. In this example, the group of bins from 1 kHz to 3.5 kHz form one sub-band (the "upper sub-band") and the group of bins from 50 Hz to 1 kHz form a separate, second sub-band (the "lower sub-band"). Thus the two sets of bins constituting frequency domain representations of the audio noise indicator signal and the information signal respectively are each divided into two groups of bins, or sub-bands, providing a high sub-band and a low sub-band for each of the noise indicator signal and the audio information signal.

The above described embodiment is carried out in the frequency domain. However, in an alternative time domain embodiment, the frequency decomposition can be effected with band-pass filters. For the two sub-band example, there are two sets of two band-pass filters, with each such set comprising one band-pass filter passing the associated range of frequencies for the lower sub-band and one band-pass filter passing the associated range of frequencies for the upper sub-band. One of the sets of two band-pass filters is associated with the noise indicator signal and one of the sets of band-pass filters is associated with the audio information signal. Thus in this exemplary embodiment, there are four band-pass filters performing the frequency decomposition process.

Figure 5:
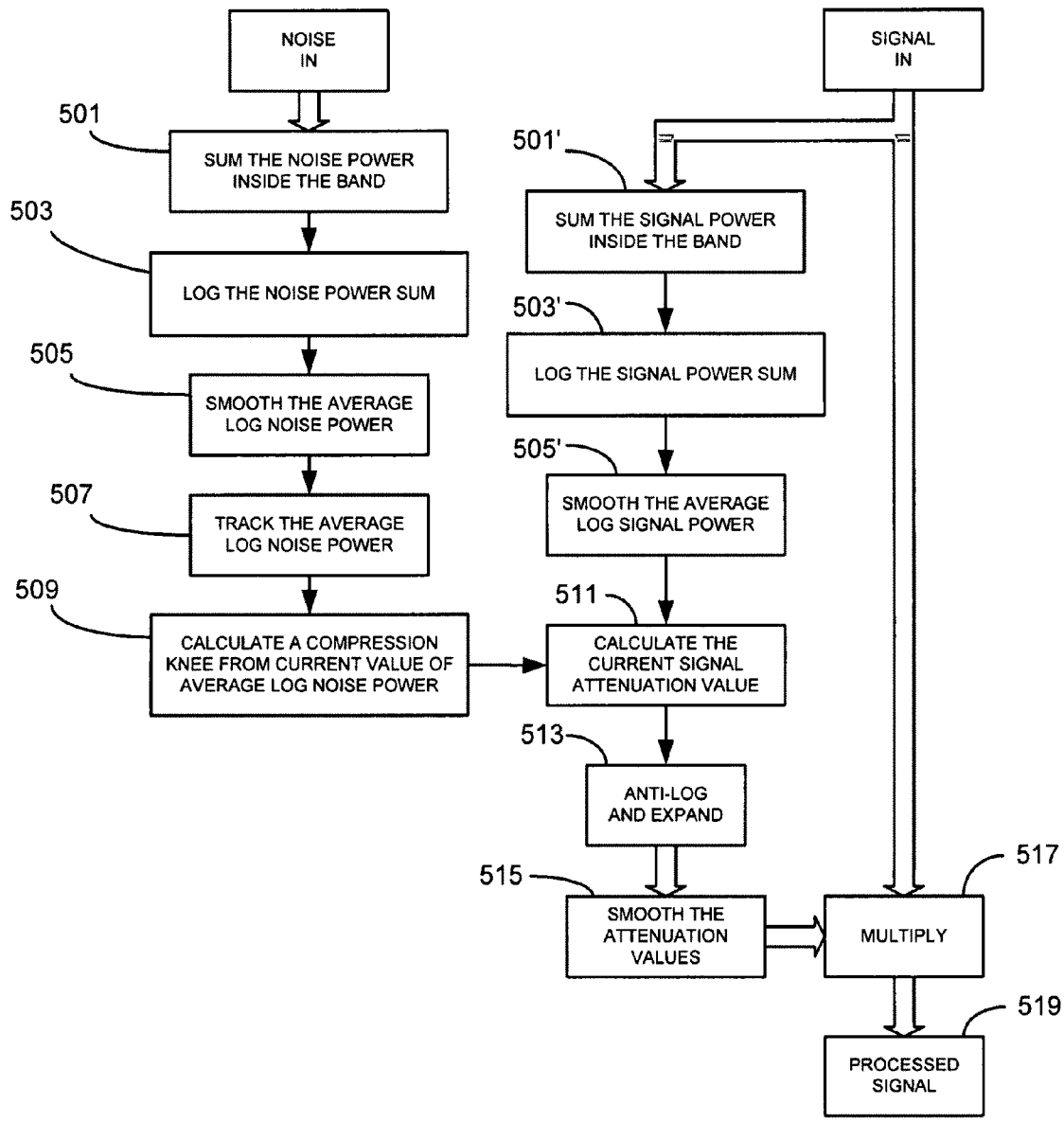
FIG. 5 is a flow diagram of a dynamic range manipulation process.
Figure 6:
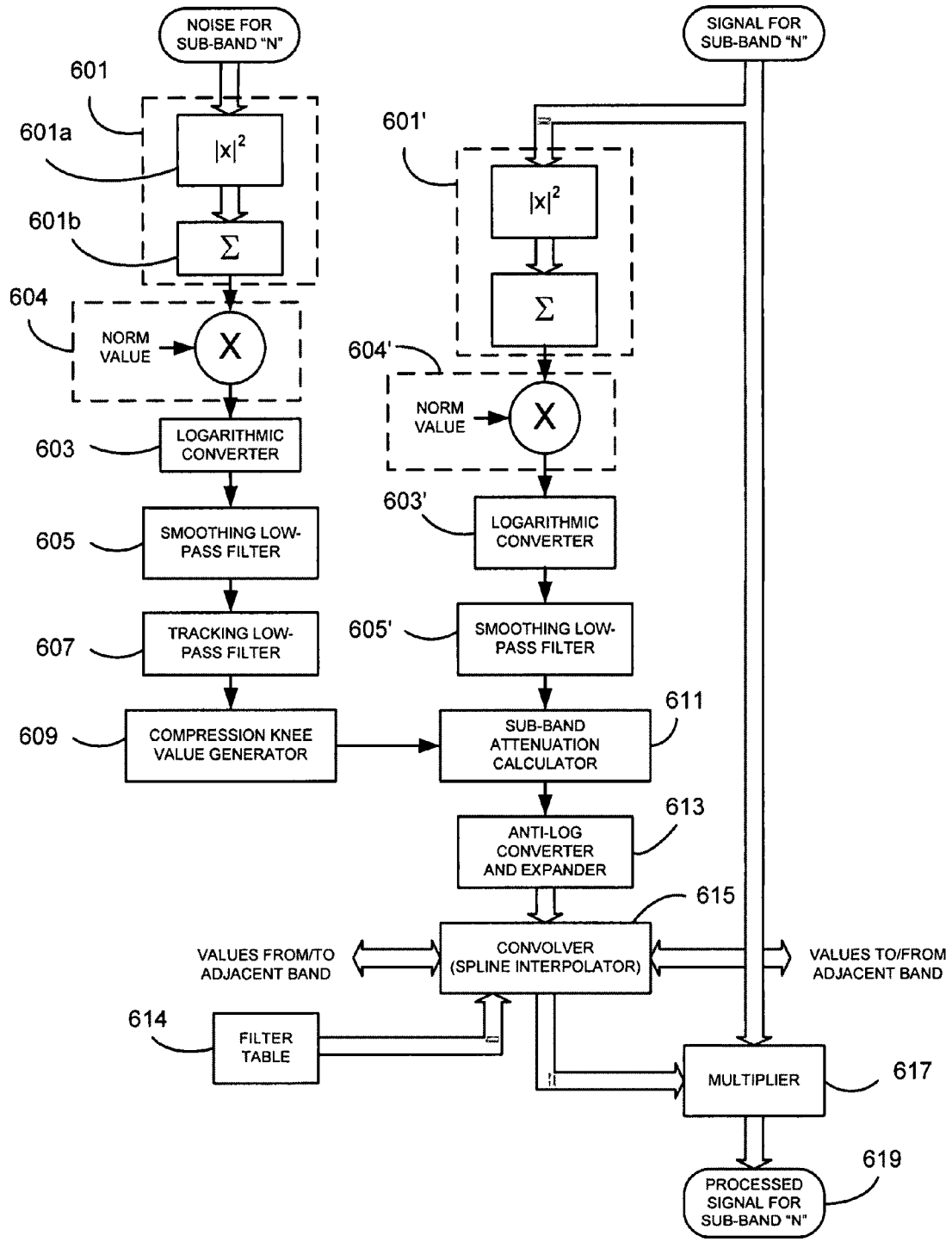
FIG. 6 is a block diagram of the processing modules or circuits used in the implementation of the process of FIG. 5.

A dynamic range manipulation control signal is developed by sub-processors 306, 308 as described with reference to FIG. 5, which shows a flow diagram of the process, and FIG. 6, which is a block diagram of the processing modules or circuits used in its implementation. For each frame of data, the process shown in FIG. 5 is performed for each sub-band. For each of the lower and upper sub-bands, the associated sub-processor 306, 308 conducts a frame power determination, which forms the basis of the gain control applied to the playback drive signal that is output to loudspeaker 206 (FIG. 2). To derive the frame power determinations for the noise and information signals respectively, the magnitude values for each frequency bin of each signal are squared and the results from all the bins for a sub-band are added together over the frequency range of the sub-band. This is shown at 501, 501' in FIG. 5 and at 601, 601' in FIG. 6. Each frame power determination is accomplished by squaring circuits or modules within 601, 601', for example 601*a* (FIG. 6), which performs the squaring of the magnitude values to form bin power values, and a summing circuit or module 601, 601', for example 601*b* (FIG. 6) which performs the summation of the bin power values within the respective sub-band of each signal. The resulting bin power sum values are then converted (503 and 503' of FIG. 5) to logarithmic bin power sum values by logarithmic converters 603, 603' (FIG. 6), providing a total of four frame power values for each frame: one associated with the noise signal in the lower sub-band, one associated with the information signal in the lower sub-band, one associated with the noise signal in the upper sub-band, and one associated with the information signal in the upper sub-band. Of course, squaring is just one of many possible power-determining approaches possible, and others are contemplated. The lower sub-band process sums the individual bin power values from bin number 3 to bin number 64 inclusive for the noise lower sub-band frame power value in the instant example, and also does this for the information lower sub-band frame power value. The upper sub-band process sums the individual bin power values from bin number 65 to bin number 224 inclusive, for the noise upper sub-band frame power value and the information upper sub-band frame power value. Each result then may be normalized by multiplying by a normalization value, which for example may be 10, if desired, as shown at 604, 604' in FIG. 6, and which may be different for each sub-band and each signal.

The frame power values thus obtained naturally vary from frame to frame, especially for the noise frame power values, and it may be desirable to reduce this variability. Accordingly, the resulting four streams of frame power values are passed through smoothing filters 605 and 605', which track the respective frame power values. It is preferable that this smoothing is performed in the logarithmic domain, so the four streams are first converted to streams of log power values as described above. Smoothing is shown at 505 and 505' in FIG. 5 and is in general a low-pass filtering process performed by low-pass smoothing filters 605 and 605' in FIG. 6. Any such low-pass filter is applicable, but in this particular example, a filter described by the following equation is used:

$$P_i = P_{i-1} + \max[-\beta, \alpha \cdot (\{10 + \log S_i\} - P_{i-1})] \tag{1}$$

where $P_i$ is the tracked power for the current frame, signal and sub-band, $P_{i-1}$ is the tracked power for the previous frame, $\alpha$ and $\beta$ are filter coefficients, $S_i$ is the summed power for the current frame, signal and sub-band, and i is the frame index. In the instant example, the values $\alpha=0.83$ (typical values range from about 0.5 to about 0.95) and $\beta=0.134$ (typical values range from about 0.01 to about 0.5) are used.

Because the noise frame power values have greater variability than the information frame power values, and further may need slower response to prevent a "pumping" sound character to be introduced into the final output of the compression system, the two sub-band noise frame power values are further smoothed by applying (507) a tracking filter 607 (again these are in the class of low-pass filters and any such filter is generally applicable for this function). In the exemplary two sub-band system, this smoothing is described by the equation $$N_i = N_{i-1} + \delta \cdot |P_i - N_{i-1}| \cdot (P_i - N_{i-1}) \tag{2}$$

where $N_i$ is the smoothed and tracked noise power for the current frame and sub-band, $N_{i-1}$ is the smoothed and tracked noise power for the previous frame and $\delta$ is the filter smoothing coefficient. The value $\delta=0.4$ (typical values range from about 0.1 to about 0.8) is used for example.

In the embodiment described here, smoothing filters 605 and 605' may have the same properties, and if they are implemented as DSP (digital signal processor) code, the same code can be used for both filters, with the tracking filtering used for the noise component accomplished by the addition of tracking filter 607. Alternatively, smoothing filter 605 and tracking filter 607 can be combined into a single filter, which may have a time constant greater than that of filter 605'.

From the smoothed and tracked noise power, a compression knee value is calculated (509, 609) for each sub-band according to the equation $$K_i = N_i + \mu \tag{3}$$

where $K_i$ is the compression knee value for the current frame and $\mu$ is an offset factor. The value $\mu=-1.2$ is used.

The significance of the compression knee value is explained with reference to the curves in FIG. 7A, which illustrates a unity-gain/zero-compression curve as a solid line, a combination of downward expansion and mild compression, separated by a threshold shown at about 52 dB, as a dashed line, and a downward expansion and strong compression separated by a threshold as a dash-dot line. Each curve of the three "compression" curves of the family represents the response at a different level of local noise, with the solid line representing the response at a low 60 dB near-end noise level, the dashed line representing the response at a greater 75 dB near-end noise level, and the dash-dot line representing the response at a large 90 dB near-end noise level. The associated noise levels themselves are shown with horizontal lines, the solid noise line corresponding to the solid "compression" curve etc. The portion of the compression curves above the respective corresponding noise level lines, or more precisely the portion above about 5 dB below the respective corresponding noise level lines, represents the portion that can be effectively heard by the near-end listener with reasonable intelligibility. That is, it is known that humans can understand speech above about −5 dB signal-to-noise ratio (SNR).

Figure 7A:
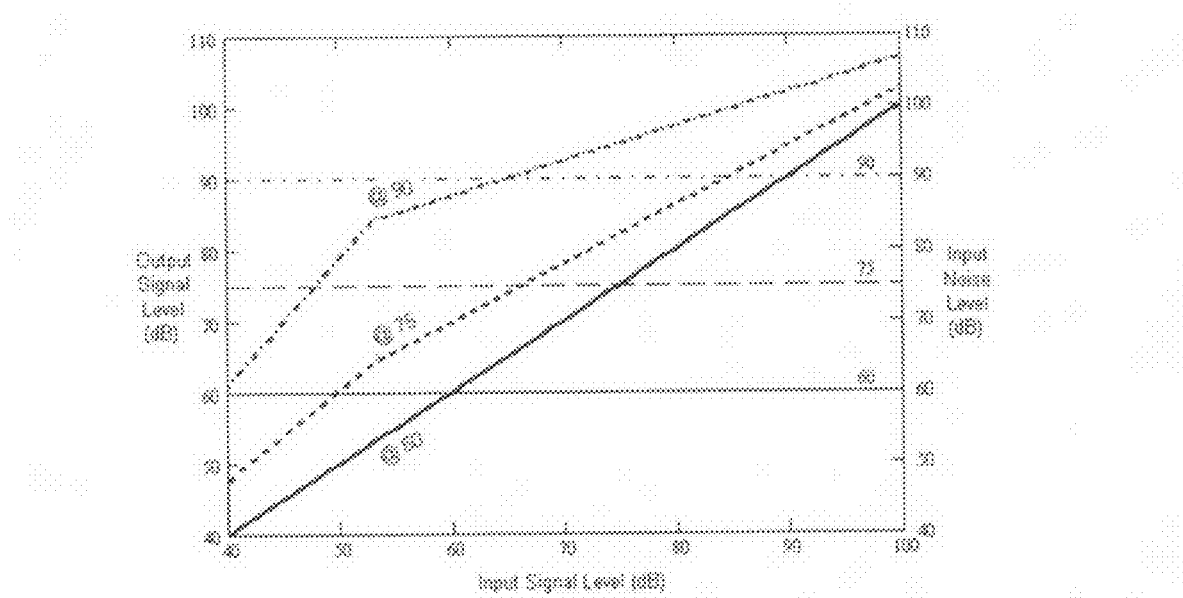
FIG. 7A is a plot of various compression/expansion curves.

In the plot of FIG. 7A, it can be seen that for the three "compression" curves, while the amount of corresponding noise differs between them, and the amount of compression differs between them, the portion of each "compression" curve that is in the intelligibility range based upon the respective near-end noise is similar for all three curves. In other words, through use of a control process that adjusts compression parameters automatically in response to near-end ambient noise, the dynamic range of the playback drive signal can be adjusted, compressing the signal into a smaller dynamic range as local noise increases, such that the signal, originating with a person's typical in-quiet dynamic range, will be compressed into a dynamic range representing the audibility region above the near-end noise masking level. The absolute levels in the plots are examples, but they constitute a reasonable representation of levels that could be applicable to a communication system. In the example plots, the axes are scaled to an equivalent acoustic dB SPL. Thus the input signal axis represents the equivalent acoustic level of the far-end signal that would have been at the user's ear if the user were able to be listening directly to the far-end talker in the two-way communication system example, the output signal axis represents the actual acoustic level of the speaker delivered sound and the noise signal axis represents the actual acoustic level of the local noise.

This compression knee value is used, along with the smoothed signal power, to create the compression gain (or attenuation), at 511 and 611, to subsequently be applied to each sub-band of the input information signal to create the output signal that is used to drive the loudspeaker 206 (FIG. 2). The compression gain is defined as $$G_i = \text{if } \left\{ K_i < \eta, 0, \text{else if } \left[ P_i \geq \eta, \left(\frac{K_i - \eta}{\mu - \eta}\right) \cdot (\mu - P_i), \text{else} \left(\frac{K_i - \eta}{\eta}\right) \cdot P_i \right] \right\} \quad (4)$$

where $G_i$ is the compression gain, expressed in logarithmic form, for the current frame and sub-band, and $\eta$ and $\mu$ are compression gain parameters. In this example, $\eta=0.4$ (typical values are between about 0.1 and about 2) and $\mu=10$ (typical values range from about 1 to about 100) are used. The result of this equation is the gain contour shown in FIG. 7B, where, in FIG. 7B, the gain from equation (4) is converted to dB for graphing purposes by multiplying by 10.

For a given instant in time, and for a particular sub-band, Equation 4 defines the compression curve, where the compression knee value is the single variable. The operation of this equation is such that the parameters define a minimum input signal level that represents the minimum equivalent audible SPL in quiet, a maximum signal level that represents the maximum equivalent acoustic SPL, and a compression knee threshold level that represents the lowest acoustic SPL that is intended to retain audibility when the listener is in noise. For the exemplary embodiment illustrated by the curves shown in FIG. 7A, the minimum equivalent input sound pressure level is set by the parameter values given above to be approximately 20 dB. At this point, which is to the left of the plotted portion of the graph, an equivalent input signal level of 20 dBSPL will produce an equivalent output signal level of 20 dBSPL, which graphically is the point where the three compression curves intersect beyond the left side of the graph. Again, for the exemplary embodiment illustrated by the curves shown in FIG. 7A, the maximum equivalent input sound pressure level is set by the parameter values to be approximately 110 dB. At this maximum point, which is to the right of the plotted portion of the graph, an equivalent input signal level of 110 dBSPL will produce an equivalent output signal level of 110 dBSPL. This is seen graphically as the point where the three compression curves intersect beyond the right side of the graph. Thirdly, again for the exemplary embodiment illustrated by the curves shown in FIG. 7A, the compression knee threshold level (the level of the input signal above which compression occurs) is set by the parameter values given above to be approximately 52 dB. At this input signal level, the compression knee (gain) value is applied to the signal. Thus, the height of the compression curve at that input signal level point is equal to the input signal level plus the compression knee value, when both are expressed in logarithmic terms (dB).

One way to visualize this single value compression control is to recognize that the minimum and maximum points are substantially fixed and that the output level equals the input level at those two fixed points. To help with the visualization, if a rubber band were stretched between those two points, and the compression knee value were applied by raising the rubber band by an amount equal to the compression knee value at the location of the compression knee threshold level, then the rubber band would take on the shape of the compression curve, i.e. such as the curves shown in FIG. 7A. Thus by the application of Equation 4, a single compression knee value determines the entire compression curve.

A feature of this compression control method is the downward expansion that is created to the left of the compression knee threshold, as is evidenced by the steeper-than-one slope of the compression curves in this region (FIG. 7A). By selecting this threshold to be just below the lowest expected input signal level of interest, over amplification of low level noise components included in the input signal is prevented, and instead these unwanted components are suppressed.

After the compression gain $G_i$ is defined by Equation 4, the gain can be converted to linear form as follows:

$$Gf_i = 10^{\frac{G_i}{2}} \quad (5)$$

where $Gf_i$ is the linear gain factor for the current frame and signal sub-band. Thus, as illustrated by Equation (5) for this exemplary embodiment, the compression gains are converted back to the linear domain from the logarithmic domain by dividing the value given by equation (4) by "2" and raising 10 to that power to create linear gain factors. This is shown at 513 in FIG. 5, as performed by a portion of anti-log converter and expander 613 in FIG. 6. This produces one linear gain factor per frame for each sub-band.

At this point, there are two sub-band linear gain factors corresponding to each frame of data. These factors are expanded back to 257 separate bin gain factors by assigning the appropriate linear gain factor to each bin number associated with all the bins in each sub-band. (513 of FIG. 5, 613 of FIG. 6) A value of zero is assigned to those bins not within any sub-band. Since adjacent sub-bands will usually have different linear gain factors, if no frequency smoothing is applied, there will be a step in gain across the adjacent sub-band boundaries and this might cause audible signal distortion. A smoothing across the frequency bin gain factors can be applied (515 of FIG. 5) after the compression gains are converted back to the linear domain and expanded into separate bin gain factors (513). The smoothing can optionally be applied, as shown in more detail as convolver/spline interpolator 615 in FIG. 6. Using a set of tapering values, known as a kernel, which may be read, for example, from table 614, or calculated from an equation, or other such method, the convolver/spline interpolator 615 smoothes the bin gain values across the transition between adjacent sub-bands by convolving the smoothing kernel with the bin gain factors. Alternatively, a short kernel, known as a spline, can be multiplied by the bin gain factors to smooth the factors across the boundaries. Other methods for smoothing across frequency are well known in the art, and any such method is contemplated. The smoothing process produces a set of bin compression gains, one associated with each frequency bin. These resulting bin compression gains are applied to the information signal by multiplying the signal in each bin by the respective bin compression gain, at 517, 617. The resulting processed output signal for each sub-band is shown at 519 in FIG. 5 and at 619 in FIG. 6.

After applying the bin compression gains, the resulting attenuated frequency multi-band signals 519, 619 are combined in the well-known inverse STFT overlap-and-add process. This is shown as the signal recomposition block 310 in FIG. 3. The result of this recomposition is a compressed full band output signal, at 312, which is the output signal that is used to drive loudspeaker 206 (FIG. 2). Alternatively, in an exemplary time-domain implementation, each band limited sub-band signal is multiplied by its respective sub-band linear gain factor at 517, 617 (FIGS. 5 and 6), and the multiple processed output signals for each sub-band are added together in the recombination step or circuit 310 to provide a compressed full band output signal, at 312, which is the signal that is the output signal used to drive the loudspeaker 206 (FIG. 2).

Figure 7B:
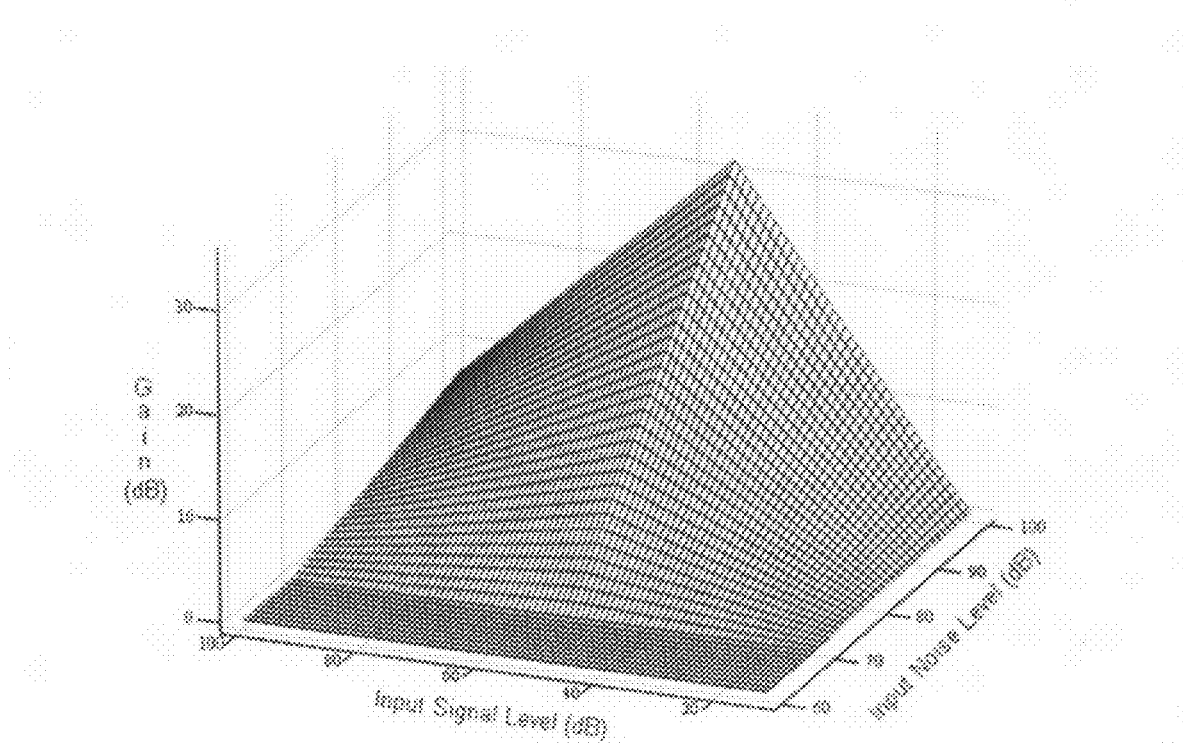
FIG. 7B is a gain contour plot for a sub-band.
Figure 7C:
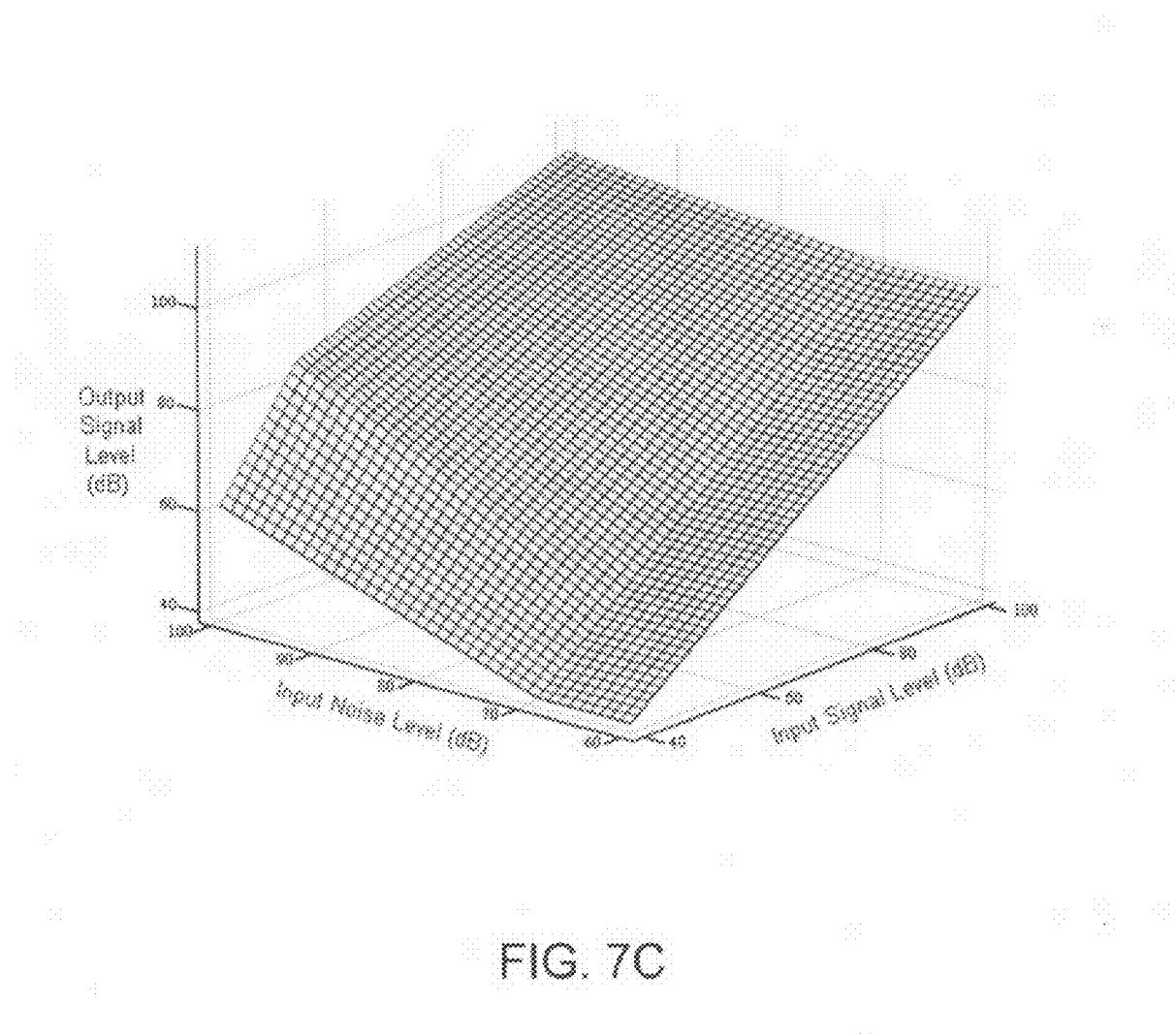
FIG. 7C is a contour of the level of the playback signal used to drive the loudspeaker 206.

The gain contour plot shown in FIG. 7B shows the gain contour for a sub-band. In the gain contour plot of FIG. 7B, the vertical axis is the gain applied to the associated sub-band of the playback information signal used to drive loudspeaker 206. It can be seen to be a function of both the level of the input local (near-end) ambient noise from indicator 208 and the instantaneous level of the input information signal from information source 204. FIG. 7C is a contour of the level of the playback signal used to drive the loudspeaker 206, which is shown as function of both the level of the input local (near-end) ambient noise from indicator 208 and the instantaneous level of the input information signal from information source 204.

It should be noted that in the processing for both the noise and information signals, signal powers are used rather than their magnitudes. By using the signal powers, computational power requirements for achieving the processed output signal are minimized. Alternatively however, the magnitudes can also be used, and such operation is also contemplated. Also, smoothing is performed with filters in the log domain rather than the linear domain, thus providing logarithmic symmetry around a logarithmic average, which is distinctly different from filtering in the linear domain. Since loudness perception in human hearing is known to follow a logarithmic characteristic, this process gives very natural sounding results, as opposed to linear domain processing. Nevertheless, these features are not intended to be limiting, and linear as well as other non-linear alternatives are also contemplated.

As explained herein, an advantage achieved by the above arrangement is the control of the compression through control of the compression knee value (the value of the gain applied at the compression threshold). In other words, the output signal level can be held at that of the input signal level (gain=1) at a maximum spl (e.g. 110 db spl, range from 90-120) and at a minimum spl (e.g. 20 db spl, range 10-40). An instantaneous gain to be applied at the compression knee threshold (e.g. 52 db spl, range 40-75) is then calculated. The compression knee threshold is the input signal level at which the transition from downward expansion to compression occurs as the input signal increases across the compression knee threshold. The gain (the compression knee value) to be applied at the compression threshold as a function of the near-end noise is determined, and the compression/expansion curve based upon that compression knee value is derived. All other points on the compression cure are determined simply from linearly interpolating between those three points (see FIG. 7A). Thus the gain applied for any one frame and any one band is a function of the input signal amplitude and the compression/expansion curve, and the compression/expansion curve is itself a function of the near-end noise level. Thus the gain applied is controlled by both the amplitude of the far-end signal and the amplitude of the near-end noise. This approach means that only one number needs to be calculated, and that one number can define the entire compression/expansion curve (per frame, per sub-band).

Thus, it will be appreciated that power measurement per se are not paramount. More importantly, what is achieved is simplified calculations that do not require "profiles" or storage, and provide appropriate amounts of compression/expansion responsive to both the far-end signal level and the near-end noise level.

While embodiments and applications have been shown and described, it would be apparent to those skilled in the art having the benefit of this disclosure that many more modifications than mentioned above are possible without departing from the inventive concepts disclosed herein. For example, tracking the power of a signal, whether noise or information, is essentially a form of envelope detection, so any type of envelope detection (or envelope following/follower) is within the scope of the invention. The invention, therefore, is not to be restricted except in the spirit of the appended claims.

What is claimed is:

1. A dynamic sound delivery method comprising:
receiving an ambient noise signal indicative of ambient noise;
receiving an information signal;
determining a gain at a predetermined information signal threshold level as a function of the level of the ambient noise signal;
generating a compression/expansion function based on the gain; and
applying compression/expansion characteristics determined from the compression/expansion function to the information signal to generate a gain-controlled output signal.

2. The method of claim 1, wherein the compression/expansion function is expressible as a curve and is based on the gain and on a first predetermined curve point below the threshold level and on a second predetermined curve point above the threshold level.

3. The method of claim 1, wherein the compression/expansion function is expressible as a curve and is based on the gain and on at least one predetermined curve point above the threshold level.

4. The method of claim 1, wherein the compression/expansion function is expressible as a curve and is based on the gain and wherein the slope of the compression/expansion function above the threshold level is a function of the level of the ambient noise signal.

5. The method of claim 1, said method being performed on a frequency band basis for at least one of the ambient noise signal and the information signal, said frequency band basis using two or more frequency bands.

6. The method of claim 1, further comprising resolving at least one of the ambient noise signal and the information signal into frequency bins.

7. The method of claim 6, further comprising squaring signal magnitudes in each frequency bin, and summing the squared signal magnitudes.

8. The method of claim 1, wherein the level of the ambient noise signal is derived from a determination of the magnitude of the ambient noise signal, the power level of the ambient noise signal, the energy of the ambient noise signal, the rms (root mean square) of the ambient noise signal or a combination thereof.

9. The method of claim 1, further comprising acoustically combining the gain-controlled output signal with the ambient noise to produce an acoustic listening signal.

10. The method of claim 9, wherein the acoustic listening signal is audible to a user.

11. The method of claim 1, wherein the gain-controlled output signal ameliorates an ambient noise induced psychoacoustic masking effect.

12. The method of claim 1, wherein the ambient noise signal is obtained from a microphone system including one or more microphones.

13. The method of claim 1, wherein the ambient noise signal is obtained from an ancillary processing operation that is independent of the dynamic sound delivery method.

14. The method of claim 1, wherein the compression/expansion function, expressed as gain verses information signal level, comprises substantially straight lines.

15. The method of claim 1, wherein the compression/expansion function, expressed as gain verses information signal level, comprises substantially straight lines connecting the gain at the predetermined information signal threshold level to a first predetermined curve gain point below the threshold level and to a second predetermined curve gain point above the threshold level.

16. A dynamic sound delivery device comprising:
   means for receiving an ambient noise signal indicative of ambient noise;
   means for receiving an information signal;
   means for determining a gain at a predetermined information signal threshold level as a function of the level of the ambient noise signal;
   means for generating a compression/expansion function based on the gain; and
   means for applying compression/expansion characteristics determined from the compression/expansion function to the information signal to generate a gain-controlled output signal.

17. The device of claim 16, wherein the compression/expansion function is expressible as a curve and is based on the gain and on a first predetermined curve point below the threshold level and on a second predetermined curve point above the threshold level.

18. The device of claim 16, wherein the compression/expansion function is expressible as a curve and is based on the gain and on at least one predetermined curve point above the threshold level.

19. The device of claim 16, wherein the compression/expansion function is expressible as a curve and is based on the gain and wherein the slope of the compression/expansion curve above the threshold level is a function of the level of the ambient noise signal.

20. The device of claim 16, wherein said means for determining, means for generating and means for applying respectively determine, generate and apply on a frequency band basis for at least one of the ambient noise signal and the information signal, said frequency band basis using two or more frequency bands.

21. The device of claim 16, further comprising means for resolving at least one of the ambient noise signal and the information signal into frequency bins.

22. The device of claim 21, further comprising means for squaring signal magnitudes in each frequency bin, and means for summing the squared signal magnitudes.

23. The device of claim 16, wherein the level of the ambient noise signal is derived from a determination of the magnitude of the ambient noise signal, the power level of the ambient noise signal, the energy of the ambient noise signal, the rms (root mean square) of the ambient noise signal or a combination thereof.

24. The device of claim 16, further comprising means for acoustically combining the gain-controlled output signal with the ambient noise to produce an acoustic listening signal.

25. The device of claim 24, wherein the acoustic listening signal is audible to a user.

26. The device of claim 16, wherein the gain-controlled output signal ameliorates an ambient noise induced psychoacoustic masking effect.

27. The device of claim 16, wherein the ambient noise signal is obtained from a microphone system including one or more microphones.

28. The device of claim 16, wherein the ambient noise signal is obtained from an ancillary processing operation that is independent of the dynamic sound delivery device.

29. The device of claim 16, wherein the compressionlexpansion function, expressed as gain verses information signal level, comprises substantially straight lines.

30. The device of claim 16, wherein the compression/expansion function, expressed as gain verses information signal level, comprises substantially straight lines connecting the gain at the predetermined information signal threshold level to a first predetermined curve gain point below the threshold level and to a second predetermined curve gain point above the threshold level.

31. A circuit for performing dynamic sound delivery, comprising:
   a first input configured to receive an ambient noise signal indicative of ambient noise;
   a second input configured to receive an information signal;
   a processor configured to:
      determine a gain at a predetermined information signal threshold level as a function of the level of the ambient noise signal;
      generate a compression/expansion function based on the gain; and
      apply compression/expansion characteristics determined from the compression/expansion function to the information signal to generate a gain-controlled output signal.

32. The circuit of claim 31, wherein the compression/expansion function is expressible as a curve and is based on the gain and on a first predetermined curve point below the threshold level and on a second predetermined curve point above the threshold level.

33. The circuit of claim 31, wherein the compression/expansion function is expressible as a curve and is based on the gain and on at least one predetermined curve point above the threshold level.

34. The circuit of claim 31, wherein the compression/expansion function is expressible as a curve and is based on the gain and wherein the slope of the compression/expansion curve above the threshold level is a function of the level of the ambient noise signal.

35. The circuit of claim 31, wherein the processor is operable on a frequency band basis for at least one of the ambient noise signal and the information signal, the frequency band basis using two or more frequency bands.

36. The circuit of claim 31, wherein said processor resolves at least one of the ambient noise signal and the information signal into frequency bins.

37. The circuit of claim 36, wherein said processor squares signal magnitudes in each frequency bin, and sums the squared signal magnitudes.

38. The circuit of claim 31, wherein the level of the ambient noise signal is derived from a determination of the magnitude of the ambient noise signal, the power level of the ambient noise signal, the energy of the ambient noise signal, the rms (root mean square) of the ambient noise signal or a combination thereof.

39. The circuit of claim 31, further comprising a circuit for acoustically combining the gain-controlled output signal with the ambient noise to produce an acoustic listening signal.

40. The circuit of claim 39, wherein the acoustic listening signal is audible to a user.

41. The circuit of claim 31, wherein the gain-controlled output signal ameliorates an ambient noise induced psychoacoustic masking effect.

42. The circuit of claim 31, wherein the ambient noise signal is obtained from a microphone system including one or more microphones.

43. The circuit of claim 31, wherein the ambient noise signal is obtained from an ancillary processing circuit that is independent of the circuit for performing dynamic sound delivery.

44. The circuit of claim 31, wherein the compression/expansion function, expressed as gain verses information signal level, comprises substantially straight lines.

45. The circuit of claim 31, wherein the compression/expansion function, expressed as gain verses information signal level, comprises substantially straight lines connecting the gain at the predetermined information signal threshold level to a first predetermined curve gain point below the threshold level and to a second predetermined curve gain point above the threshold Level.

46. A playback system comprising:
a noise indicia generating circuit configured to provide an ambient noise signal indicative of ambient noise;
an information signal generating circuit configured to provide an information signal;
a processor configured to:
determine a gain at a predetermined information signal threshold level as a function of the level of the ambient noise signal;
generate a compression/expansion function based on the gain; and
apply compression/expansion characteristics determined from the compression/expansion function to the information signal to generate a gain-controlled output signal;
a circuit for acoustically combining the gain-controlled output signal with the ambient noise to produce an acoustic listening signal; and
a loudspeaker configured to receive the acoustic listening signal and generate an audible signal therefrom.

47. The system of claim 46, wherein the compression/expansion function is expressible as a curve and is based on the gain and on a first predetermined curve point below the threshold level and on a second predetermined curve point above the threshold level.

48. The system of claim 46, wherein the compression/expansion function is expressible as a curve and is based on the gain and on at least one predetermined curve point above the threshold level.

49. The system of claim 46, wherein the compression/expansion function is expressible as a curve and is based on the gain and wherein the slope of the compression/expansion curve above the threshold level is a function of the level of the ambient noise signal.

50. The system of claim 46, wherein the processor is operable on a frequency band basis for at least one of the ambient noise signal and the information signal, the frequency band basis using two or more frequency bands.

51. The system of claim 46, wherein the processor resolves at least one of the ambient noise signal and the information signal into frequency bins.

52. The system of claim 51, wherein the processor squares signal magnitudes in each frequency bin, and sums the squared signal magnitudes.

53. The system of claim 46, wherein the Level of the ambient noise signal is derived from a determination of the magnitude of the ambient noise signal, the power level of the ambient noise signal, the energy of the ambient noise signal, the rms (root mean square) of the ambient noise signal or a combination thereof.

54. The system of claim 46, wherein the gain-controlled output signal ameliorates an ambient noise induced psychoacoustic masking effect.

55. The system of claim 46, further comprising one or more microphones coupled to the noise signal indicia generating circuit to provide signals thereto.

56. The system of claim 46, wherein the compression/expansion function, expressed as gain verses information signal level, comprises substantially straight lines.

57. The system of claim 46, wherein the compression/expansion function, expressed as gain verses information signal level, comprises substantially straight lines connecting the gain at the predetermined information signal threshold level to a first predetermined curve gain point below the threshold level and to a second predetermined curve gain point above the threshold level.

* * * * *